(12) United States Patent
Mori

(10) Patent No.: US 6,475,879 B2
(45) Date of Patent: Nov. 5, 2002

(54) SEMICONDUCTOR WAFER, METHOD FOR PROCESSING THE SAME AND METHOD FOR MANUFACTURING SEMICONDUCTOR DEVICE

(75) Inventor: Katsumi Mori, Sakata (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/761,958

(22) Filed: Jan. 17, 2001

(65) Prior Publication Data

US 2001/0049179 A1 Dec. 6, 2001

(30) Foreign Application Priority Data

Jan. 18, 2000 (JP) ........................................ 2000-009368

(51) Int. Cl.$^7$ ............................................... H01L 21/46
(52) U.S. Cl. ..................... 438/461; 438/291; 438/292; 438/692; 438/693; 438/706
(58) Field of Search ................................. 438/461, 291, 438/292, 692, 693, 706

(56) References Cited

U.S. PATENT DOCUMENTS

| | | | | |
|---|---|---|---|---|
| 4,786,867 A | * | 11/1988 | Yamatsu | 324/158 |
| 5,240,874 A | * | 8/1993 | Roberts | 437/69 |
| 6,057,245 A | * | 5/2000 | Annapragada et al. | 438/706 |
| 6,069,083 A | * | 5/2000 | Miyashita et al. | 438/693 |
| 6,214,734 B1 | * | 4/2001 | Bothra et al. | 438/692 |

* cited by examiner

*Primary Examiner*—Vu A. Le
*Assistant Examiner*—Pho M. Luu
(74) *Attorney, Agent, or Firm*—Harness, Dickey & Pierce, P.L.C.

(57) ABSTRACT

A method is provided for processing a semiconductor wafer having a chip region where chips are formed and a non-chip region where chips are not normally formed. The method includes the steps of forming trench isolation regions in the semiconductor wafer, and forming dummy trench isolation regions in at least a part of the non-chip region of the semiconductor wafer.

13 Claims, 12 Drawing Sheets

Fig. 12 (a) (Prior Art)
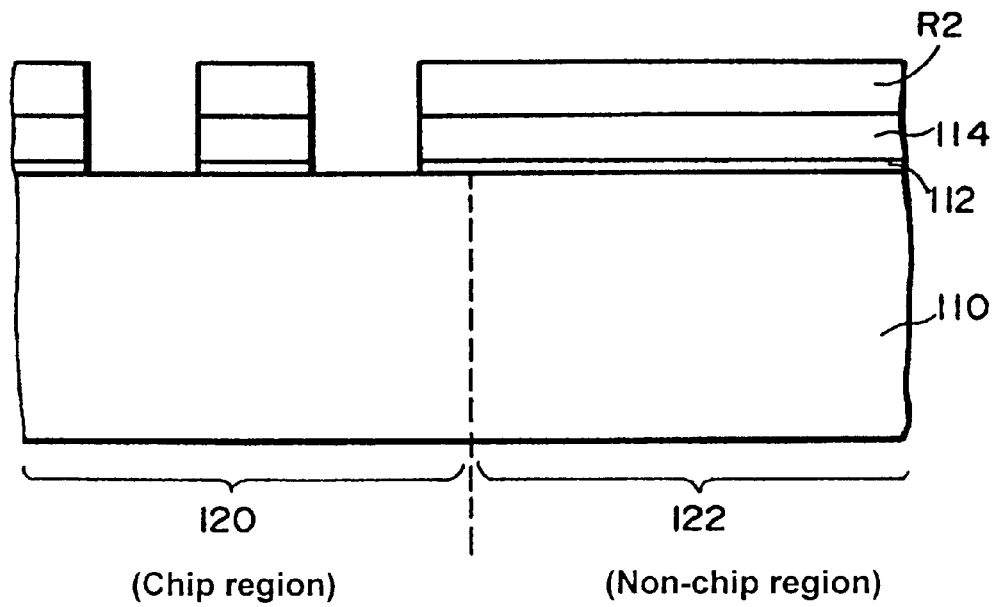
Fig. 12 (b) (Prior Art)
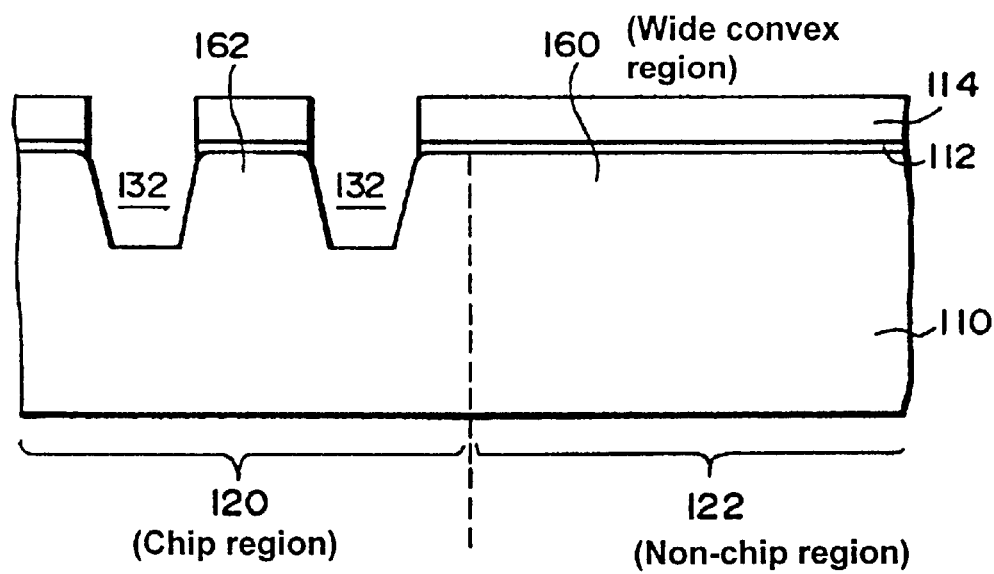

Fig. 13 (a) (Prior Art)
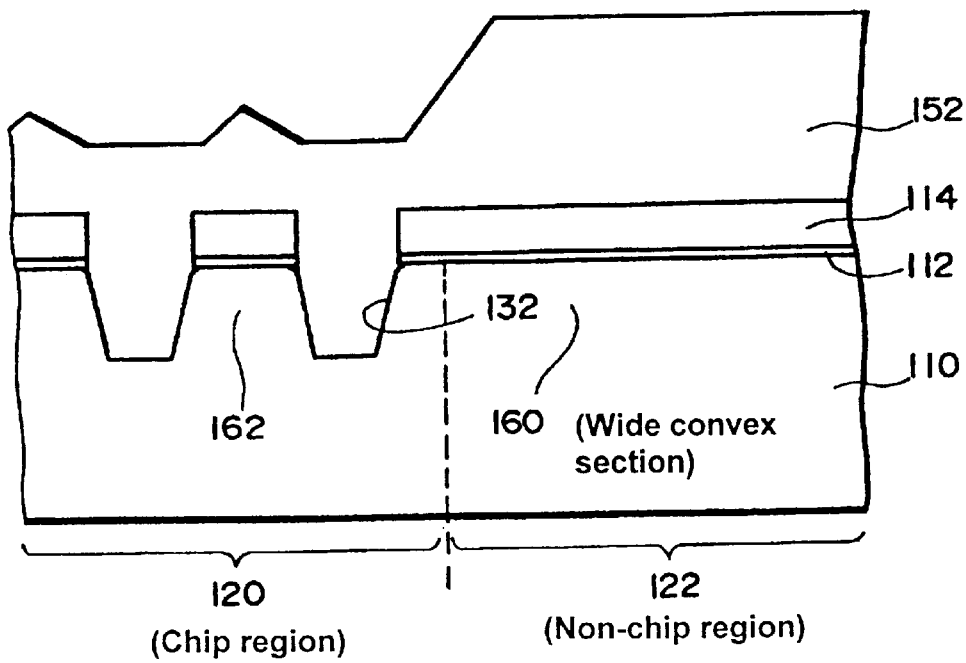
Fig. 13 (b) (Prior Art)
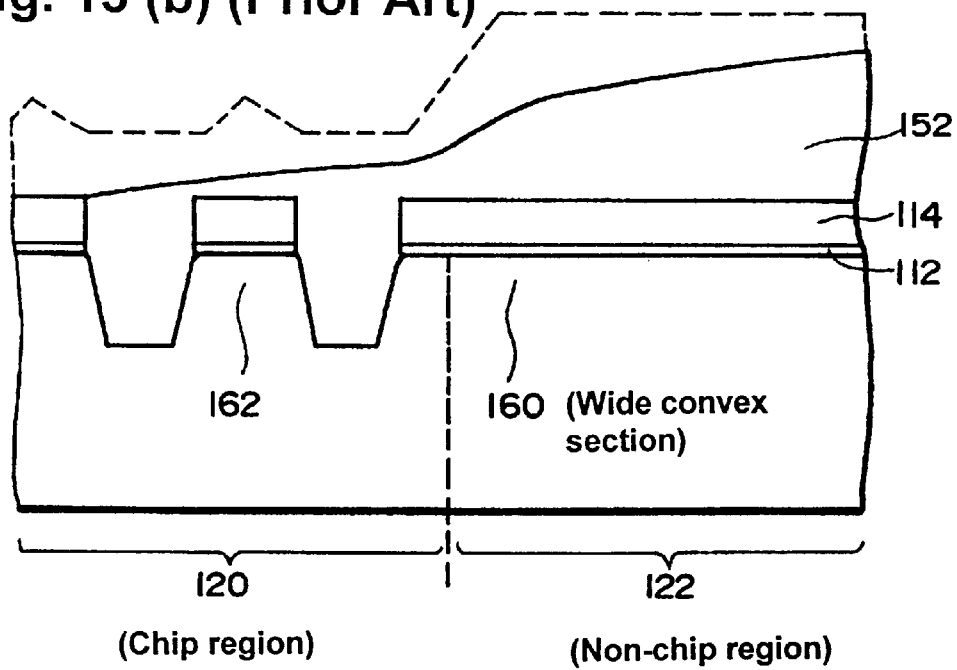

SEMICONDUCTOR WAFER, METHOD FOR PROCESSING THE SAME AND METHOD FOR MANUFACTURING SEMICONDUCTOR DEVICE

TECHNICAL FIELD

The present invention relates to semiconductor wafers, a method for processing the same and a method for manufacturing semiconductor devices. The present invention particularly relates to semiconductor wafers having element isolation regions, a method for processing the same and a method for manufacturing semiconductor devices.

BACKGROUND

With the miniaturization of semiconductor devices (for example, MOS transistors) promoted in recent years, a further miniaturization of element isolation regions in semiconductor devices is required. In order to achieve a further miniaturization of element isolation regions in semiconductor devices, a trench isolation technique has been introduced. In the trench isolation technique, trenches are provided between semiconductor elements on a semiconductor substrate, and a dielectric material is filled in the trenches to isolate the semiconductor elements from one another. One example of the element isolation technique will be described below.

FIGS. 11 through 13 schematically show steps of forming element isolation regions using a conventional trench isolation technique. FIG. 11 is a plan view of a semiconductor wafer over which a pad layer, a polishing stopper layer and a resist layer are successively deposited, and also shows, for description purposes, a range of exposure of the resist layer formed over the semiconductor wafer. FIGS. 12 and 13 schematically show cross-sectional views taken along a line B—B of FIG. 11 in different steps.

First, a pad layer 112, a polishing stopper layer 114 and a resist layer R2 are successively deposited over a semiconductor wafer 110. Then, as shown in FIG. 11, the resist layer R2 only in a chip region 120 is exposed.

Next, as shown in FIG. 12(a), the resist layer R2 is developed to form the resist layer R2 into a specified pattern. Then, the polishing stopper layer 114 and the pad layer 112 are removed using the resist layer R2 as a mask.

Then, as shown in FIG. 12(b), the resist layer R2 is removed and trenches 132 are formed in the semiconductor wafer 110 using the polysilicon layer 114 as a mask.

As shown in FIG. 13(a), a dielectric layer 152 is formed over the semiconductor wafer 110 in a manner to fill the trenches 132 with the dielectric layer 152.

Next, as shown in FIG. 13(b), the dielectric layer 152 is polished by a chemical-mechanical polishing method (hereafter referred to as a "CMP method"). Through the steps described above, the dielectric layer 152 is embedded in the trenches 132, and thereby trench isolation regions are formed.

In order to prevent the throughput of the exposure step from lowering, the resist layer R2 in the non-chip region 122 is not generally exposed, as shown in FIG. 11. As a result, as shown in FIG. 12(b), after the trenches 132 are formed in the semiconductor wafer 110, a relatively wide convex region 160 is formed in the non-chip region 122 adjacent to the chip region 120. The relatively wide convex region 160 formed in the non-chip region 122 adjacent to the chip region 120 causes the following problems.

As shown in FIG. 13(a), when the dielectric layer 152 is formed over the semiconductor wafer 110, the dielectric layer 152 is thickly deposited over the wide convex region 160. If the dielectric layer 152 is polished while the dielectric layer 152 is thickly deposited in the wide convex region 160, the dielectric layer 152 deposited in the wide convex region 160 remains more than the dielectric layer 152 deposited over the chip region 120. Also, due to the presence of the thick dielectric layer 152 formed in the wide convex region 160, the dielectric layer 152 remains in an area over a convex section 162 adjacent to the wide convex region 160. In other word, the dielectric layer 152 in the chip region 120 remains in an area over the convex section 162 adjacent to the non-chip region 122. When the dielectric layer 152 in the chip region 120 remains in an area over the convex section 162 adjacent to the non-chip region 122, the polishing stopper layer 114 cannot be removed, and a semiconductor element cannot be formed over the convex section 162.

Furthermore, if the dielectric layer 152 is polished while the dielectric layer 152 is thickly deposited in the wide convex region 160, the thinning and dishing phenomenon occur. These phenomenon cause variations in the thickness of the dielectric layer 152.

Because of the reasons described above, when the relatively wide convex region 160 is formed in the non-chip region 122 adjacent to the chip region 120, chips that are formed in outermost areas (areas indicated by crosses (x) in FIG. 11) of the chip region 120 may become bad chips. In other words, the yield of chips formed in the chip region other than the outermost areas is lowered.

SUMMARY (1) In accordance with a first embodiment of the present invention, a method is provided for processing a semiconductor wafer having a chip region and a non-chip region. In accordance with the method, a dummy trench isolation region is formed in at least a part of the non-chip region of the semiconductor wafer.

The "chip region" used here refers to a region in a semiconductor wafer where chips can be formed according to a specified pattern, and the "non-chip region" used here refers to a region in the semiconductor wafer where chips cannot be formed according to the specified pattern.

In the method for processing a semiconductor wafer in accordance with the first embodiment, a dummy trench isolation region is formed in at least a part of the non-chip region of the semiconductor wafer. In other words, when trenches are formed in the semiconductor wafer to form trench isolation regions in the semiconductor wafer, dummy trenches are formed in the non-chip region. As a result, when a dielectric layer is filled in the trenches, the dielectric layer is prevented from being thickly deposited in a convex region in the non-chip region. Therefore, when the dielectric layer is polished, the dielectric layer is prevented from remaining in convex sections in the chip region adjacent to the non-chip region by the influence of the dielectric layer deposited over the non-chip region.

(2) In accordance with a second embodiment of the present invention, a semiconductor wafer having a chip region and a non-chip region is processed by a method including the step of forming trench isolation regions in the semiconductor wafer. In one aspect of the second embodiment of the present invention, the trench isolation regions may be formed by a method including at least the following steps. (a) A polishing stopper layer having a specified pattern is formed over the semiconductor wafer. (b) Trenches in the chip region and dummy trenches in at least a portion of the non-chip region in the semiconductor wafer are formed using at least the polishing stopper layer as a mask. (c) A dielectric layer is formed over the semiconductor wafer in a manner to fill the trenches and the dummy trenches with the dielectric layer. (d) The insulation layer is polished using the polishing stopper layer as a stopper.

The method for processing a semiconductor wafer in accordance with the second embodiment of the present invention provides the same effects as those provided by the first embodiment of the present invention.

(3) In accordance with a third embodiment of the present invention, a semiconductor wafer having a chip region and a non-chip region is processed by a method including the step of forming trench isolation regions in the semiconductor wafer. In one aspect of the third embodiment of the present invention, the trench isolation regions may be formed by a method including at least the following steps. (h) A polishing stopper layer is formed over the semiconductor wafer. (i) A resist layer is formed over the polishing stopper layer. (j) The resist layer in the chip region and at least one specified portion of the non-chip region are exposed. (k) The resist layer is developed. (l) The polishing stopper layer is removed in a specified pattern using the resist layer as a mask. (m) The semiconductor wafer is etched using at least the polishing stopper layer to form trenches in the chip region and dummy trenches in the non-chip region. (n) A dielectric layer is formed over the semiconductor wafer in a manner to fill the trenches and the dummy trenches with the dielectric layer. (o) The insulation layer is polished using the polishing stopper layer as a stopper.

The method for processing a semiconductor wafer in accordance with the third embodiment of the present invention provides the same effects as those provided by the first embodiment of the present invention.

In the method for processing a semiconductor wafer in accordance with the third embodiment of the present invention, a photomask may preferably be used in the step (j) to simultaneously expose the resist layer in the chip region and the at least one specified portion of the non-chip region.

As a result, the throughput in the exposure step is improved compared to the case in which different photomasks are used to expose the resist layer in the chip region and the at least one specified portion of the non-chip region, respectively.

In accordance with an embodiment of the present invention, a semiconductor wafer comprises a chip region and a non-chip region, wherein at least one portion of the non-chip region includes at least one dummy trench isolation region.

When semiconductor devices are manufactured using a semiconductor wafer that is processed in accordance with the embodiment of the present invention, the yield of chips in a chip region adjacent to a non-chip region of the semiconductor wafer is increased for the reasons described above in conjunction with the description of the method for processing semiconductor wafers.

In accordance with an embodiment of the present invention, a method for manufacturing a semiconductor device includes any one of the semiconductor wafer processing methods described above.

By the method for manufacturing a semiconductor device in accordance with the present embodiment of the present invention, the yield of chips in a chip region adjacent to a non-chip region of the semiconductor wafer is increased for the reasons described above in conjunction with the description of the method for processing semiconductor wafers.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

FIGS. 12(a) and 12(b) schematically show cross-sectional views of an element isolation region in different forming steps of a conventional trench isolation technique.

FIGS. 13(a) and 13(b) schematically show cross-sectional views of an element isolation region in different forming steps of a conventional trench isolation technique.

DETAILED DESCRIPTION

Preferred embodiments are described with reference to the accompanying drawings.

[Semiconductor Wafer]

Figure 1:
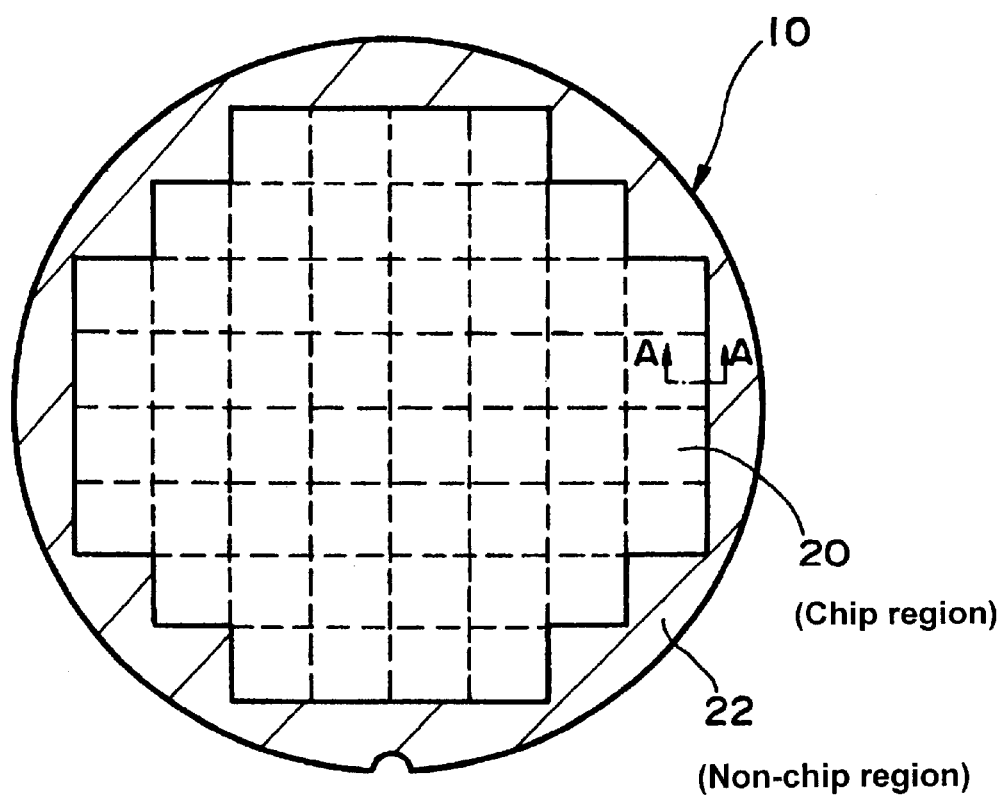
FIG. 1 schematically shows a plan view of a semiconductor wafer.
Figure 2:
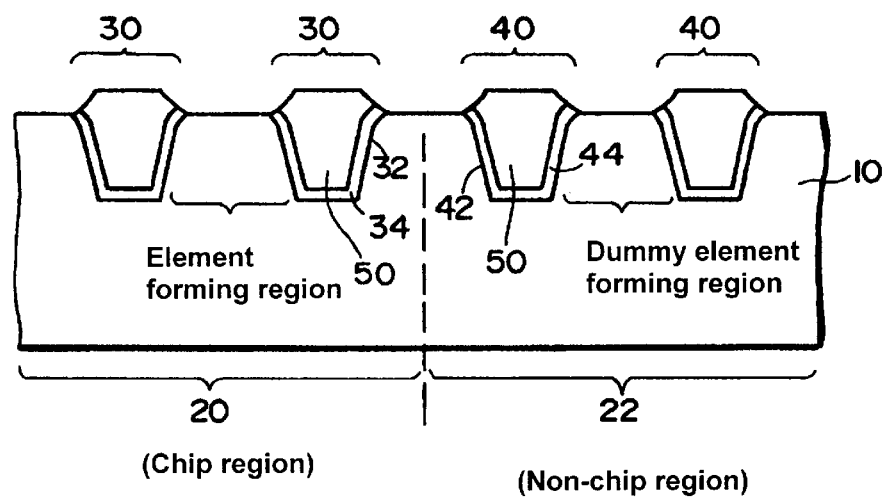
FIG. 2 shows a cross-sectional view taken along a line A—A of FIG. 1.

A semiconductor wafer in accordance with one embodiment of the present invention is described below. FIG. 1 schematically shows a plan view of a semiconductor wafer 10. FIG. 2 shows a cross-sectional view taken along a line A—A of FIG. 1.

The semiconductor wafer 10 is subject to certain process steps, and has the following structure. The semiconductor wafer 10 defines a chip region 20 and a non-chip region 22 (that is indicated by hatching in FIG. 1). The "chip region 20" used here refers to a region in the semiconductor wafer 10 where chips can be formed according to a specified pattern. The "non-chip region 22" used here refers to a region in the semiconductor wafer 10 where chips cannot be formed according to the specified pattern. Sectional regions divided by broken lines in the chip region 20 in FIG. 1 define chip units.

As shown in FIG. 2, trench isolation regions 30 are formed at specified locations in the chip region 20 of the semiconductor wafer 10. Dummy trench isolation regions 40 are formed at specified locations in the non-chip region 22 of the semiconductor wafer 10.

The trench isolation regions 30 isolate element forming regions from one another and to define the element forming regions. The trench isolation regions 30 are formed from trench dielectric layers 50 filled in trenches 32 that are formed in the semiconductor wafer 10. Trench oxide layers 34 are interposed between the semiconductor wafer 10 and the trench dielectric layers 50.

The dummy trench isolation regions 40 define dummy element forming regions. The dummy trench isolation regions 40 have the same structure as that of the trench isolation regions 30. In one embodiment, the dummy trench isolation regions 40 are formed from trench dielectric layers 50 filled in dummy trenches 42 that are formed in the semiconductor wafer 10. Trench oxide layers 44 are interposed between the semiconductor wafer 10 and the trench dielectric layers 50.

[Method for Processing Semiconductor Wafer]

A method for processing a semiconductor wafer in accordance with one embodiment of the present invention is described below. More specifically, a method for forming trench isolation regions in a semiconductor wafer is described. FIGS. 3 through 8 schematically show cross-sectional views of a semiconductor wafer in different processing steps in accordance with one embodiment of the present invention.

Figure 3:
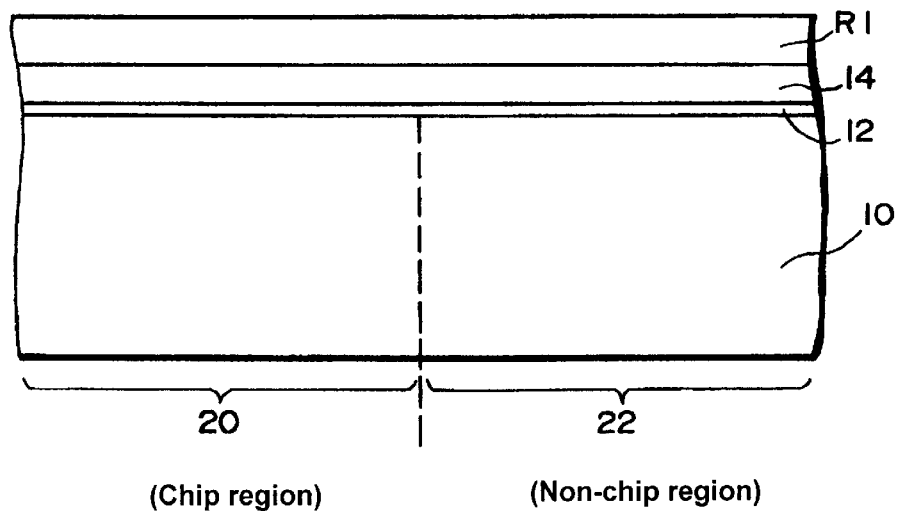
FIG. 3 schematically shows a cross-sectional view of a semiconductor wafer in a semiconductor wafer process step in accordance with one embodiment of the present invention.

(1) Referring to FIG. 3, a pad layer 12 is formed over a semiconductor substrate 10. The pad layer 12 may be formed from, for example, a silicon oxide, a silicon oxide nitride, and the like. When the pad layer 12 is formed from a silicon oxide, the pad layer 12 may be formed by a thermal oxidation method or a CVD method. When the pad layer 12 is formed from a silicon oxide nitride, the pad layer 12 may be formed by a CVD method. The thickness of the pad layer 12 is, for example, 2–20 nm.

Next, a polishing stopper layer 14 is formed over the pad layer 12. The polishing stopper layer 14 may have a single-layer structure or a multiple-layer structure. As a single-layer structure, any one of a silicon nitride layer, a polycrystal silicon layer and an amorphous silicon layer can be used. A multiple-layer structure may be formed from at least two layers selected from a silicon nitride layer, a polysilicon layer and an amorphous silicon layer. The polishing stopper layer 14 can be formed by a known method such as a CVD method. The polishing stopper layer 14 has a thickness that sufficiently functions as a stopper in a polishing step for polishing a dielectric layer to be performed later. For example, the polishing stopper layer 14 has a thickness of about 50–250 nm.

Then, a resist layer R1 is coated over the polishing stopper layer 14 by a known method.

Figure 4:
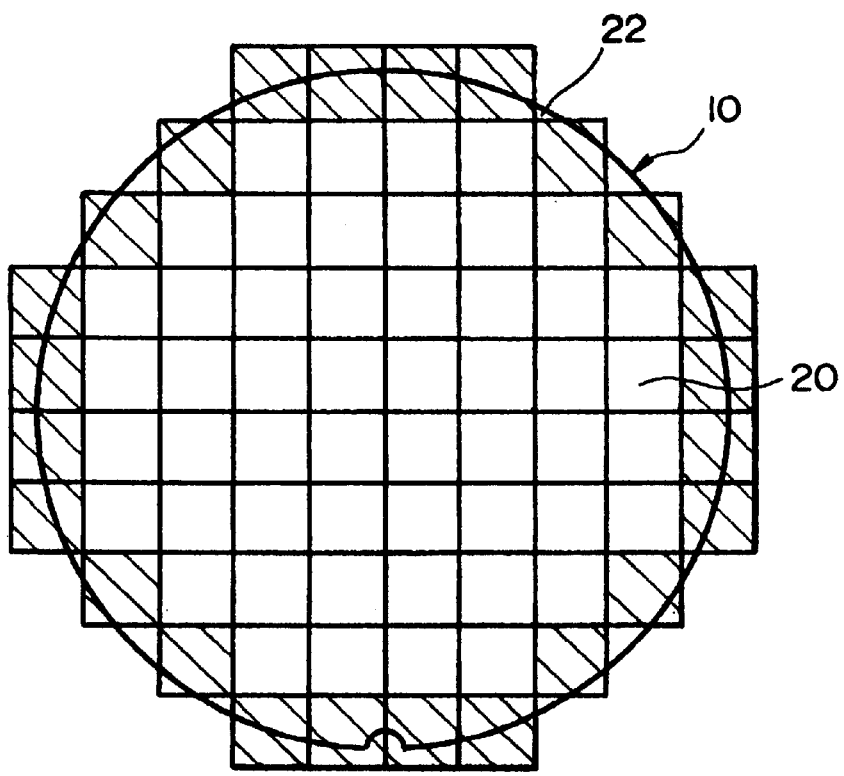
FIG. 4 schematically shows a cross-sectional view of a semiconductor wafer in a semiconductor wafer process step in accordance with one embodiment of the present invention.
Figure 5:
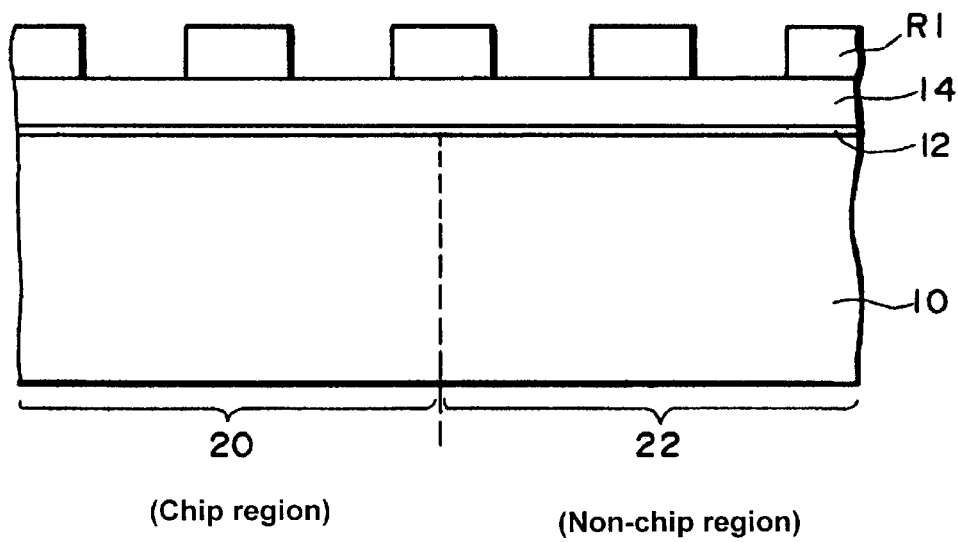
FIGS. 5(a) and 5(b) schematically show cross-sectional views of a semiconductor wafer in semiconductor wafer process steps in accordance with one embodiment of the present invention.
Figure 5:
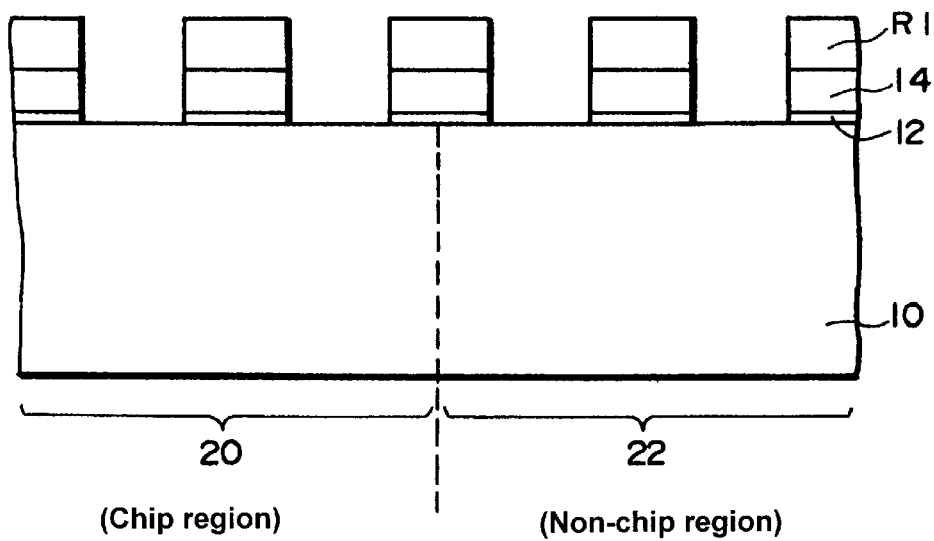
Figure 6:
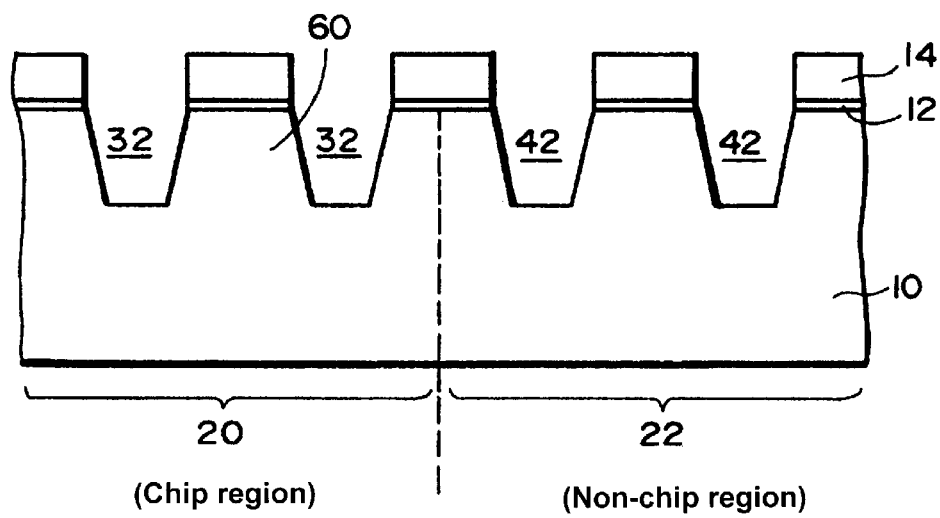
FIGS. 6(a) and 6(b) schematically show cross-sectional views of the semiconductor wafer in semiconductor wafer process steps in accordance with one embodiment of the present invention.
Figure 6:
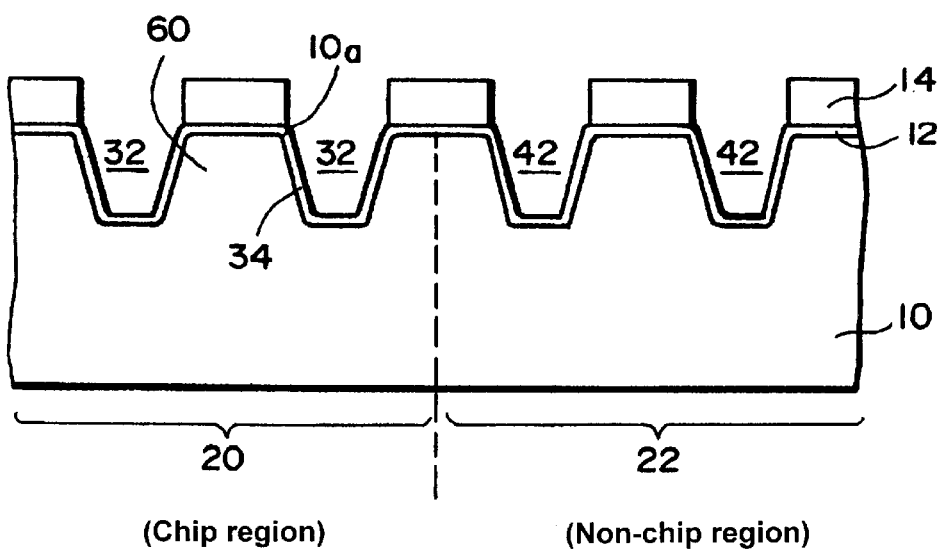
Figure 7:
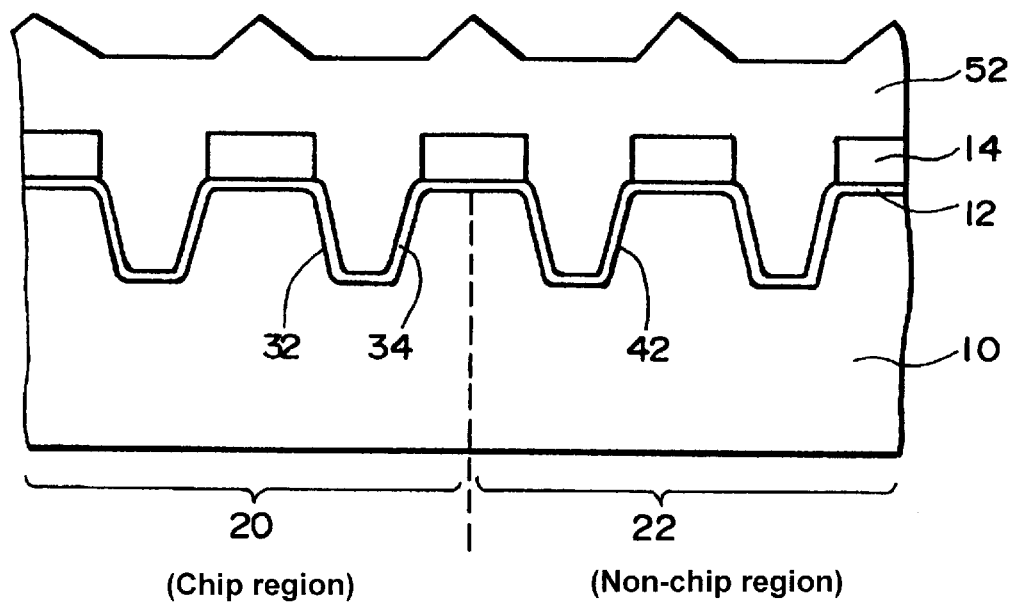
FIGS. 7(a) and 7(b) schematically show cross-sectional views of the semiconductor wafer in semiconductor wafer process steps in accordance with one embodiment of the present invention.
Figure 7:
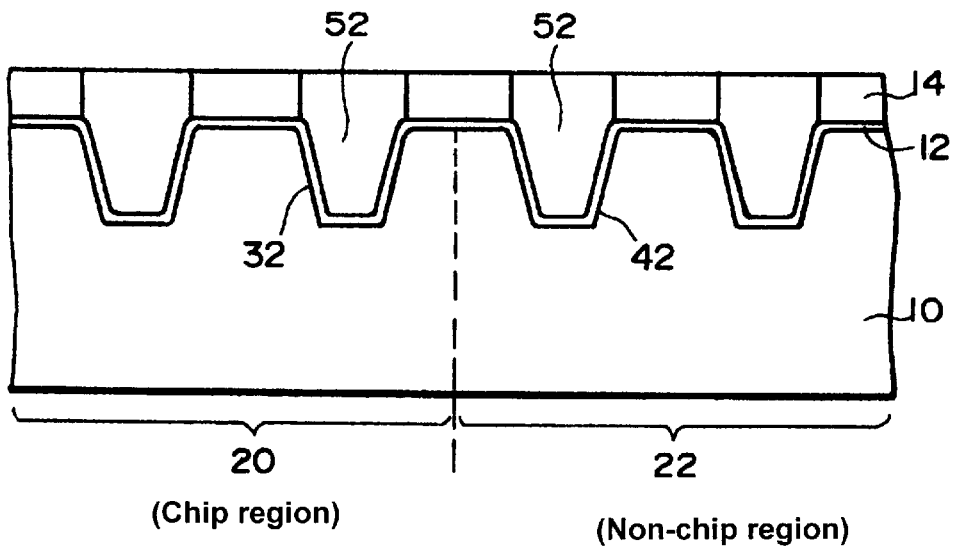

Next, the resist layer R1 is exposed. FIG. 4 shows an area to be exposed in the semiconductor wafer 10.

In the exposure step, not only the chip region 20 but also the non-chip region 22 are exposed. In one embodiment, a shot is performed over the chip region 20 and a dummy shot is simultaneously performed over the non-chip region 22 (preferably over a region indicated by hatching in FIG. 4). In one embodiment, one shot may be performed over the chip region 20 and the non-chip region 22 to simultaneously expose the chip region 20 and the non-chip region 22.

The chip region 20 may be exposed by any known method. For example, when light is used to expose the chip region 20, a method using a reduction-projection exposure apparatus or a method using a 1:1 projection exposure apparatus may be used. When electron beam is used to expose the chip region 20, a method using a direct drawing method can be used. The method using a reduction-projection exposure apparatus may preferably be conducted by a step-and-repeat method or a step-and-scan method.

The dummy shot is performed to form dummy trenches 42 (to be described below) in the non-chip region 22. The dummy shot may preferably be performed in a manner that the dummy trenches 42 are formed in the non-chip region 22 in an area adjacent to the chip region 20. The non-chip region 22 may be exposed by any method and is not limited to any specific method as long as the non-chip region 22 is exposed. For example, when light is used to expose the non-chip region 22, a method using a reduction-projection exposure apparatus or a method using a 1:1 projection exposure apparatus may be used. When electron beam is used to expose the non-chip region 22, a method using a direct drawing method can be used. The method using a reduction-projection exposure apparatus may preferably be conducted by a step-and-repeat method or a step-and-scan method. Also, the non-chip region 22 may preferably be exposed by the same exposure method used for exposing the chip region 20, in order to improve the throughput of the exposure step. Any photomask may be used for exposing the non-chip region 22 as long as the dummy trenches 42 can be formed in the non-chip region 22. A photomask may be used for exposing the chip region 20 as well as for exposing the non-chip region 22. Alternatively, different photomasks may be used for exposing the chip region 20 and for exposing the non-chip region 22, respectively. In view of improvement in the throughput in the exposure step, the same photomask may be used both for exposing the chip region 20 and for exposing the non-chip region 22.

Next, the resist layer R1 is developed to form the resist layer R1 into a specified pattern, as shown in FIG. 5(a).

(2) As shown in FIG. 5(b), the polishing stopper layer 14 and the pad layer 12 are etched using the resist layer R1 as a mask. The etching may be conducted by, for example, a dry etching method.

(3) As shown in FIG. 6(a), the resist layer R1 is removed. For example, the resist layer R1 may be removed by an ashing method. Then, the semiconductor wafer 10 is etched using the polishing stopper layer 14 as a mask to form trenches 32 and 42. More specifically, the trenches 32 are formed in the chip region 20 and the dummy trenches 42 are formed in the non-chip region 22. The depth of the trenches 32 and 42 may be different depending on device designs, but may be about 300–500 nm. The semiconductor wafer 10 may be etched by a dry etching method. Each of convex regions 60 may preferably have a tapered cross section. Because of reasons described below, the convex regions 60 with a tapered cross section facilitate embedding a dielectric layer 52 in the trenches 32 and 42. The cross-sectional shape of each of the convex regions 60 has a taper angle α, which is preferably about 70 degree or greater but less than 90 degree.

Next, although not shown in the figures, end portions of the pad layer 12 between the silicon substrate 10 and the polishing stopper layer 14 are etched.

(4) As shown in FIG. 6(b), exposed surfaces of the semiconductor substrate 10 in the trenches 32 and 42 are oxidized by a thermal oxidation method to thereby form a trench oxidation film 34. Since the end portions of the pad layer 12 are etched, shoulder sections 10a of the convex regions 60 are oxidized and rounded by the thermal oxidation. For example, the trench oxide layer 34 may have a film thickness of about 10–70 nm, and more preferably 10–50 nm.

(5) As shown in FIG. 7(a), a dielectric layer 52 is deposited over the entire surface of the semiconductor substrate in a manner to embed the trenches 32 and 42 with the dielectric layer 52. The dielectric layer 52 may be formed from, for example, silicon oxide. The thickness of the dielectric layer 52 is not limited to a particular range as long as the thickness of the dielectric layer 52 is sufficient to embed the trenches 32 and 42 and cover at least the polishing stopper layer 14. For example, the dielectric layer 52 may have a film thickness of 500–800 nm. The dielectric layer 52 may be deposited by, for example, a high-density plasma CVD (HDP—CVD) method, a thermal CVD method, a TEOS plasma CVD method or the like.

The following effects are obtained in the deposition of the dielectric layer 52. Since the dummy trenches 42 are formed in the non-chip region 22, a wide convex section is not formed in the non-chip region 22 adjacent to the chip region 20. As a result, the dielectric layer 52 is prevented from being thickly deposited in the non-chip region 22 adjacent to the chip region 20.

(6) As shown in FIG. 7(b), the dielectric layer 52 is planarized by a CMP method. The planarization is conducted until the polishing stopper layer 14 is exposed. In other words, the dielectric layer 52 is planarized using the polishing stopper layer 14 as a stopper.

The following effects are obtained in the planarization step. If a portion of the dielectric layer 52 deposited over the non-chip region 22 is substantially thicker than other portions of the dielectric layer 52 deposited over the chip region 20, the dielectric layer 52 may remain over the polishing stopper layer 14 in outermost regions of the chip region 20 adjacent to the non-chip region 22, after the polishing of the dielectric layer 52 in the chip region 20 is completed, due to the presence of the thick dielectric layer 52 deposited over the non-chip region 22. However, in the present embodiment, the dielectric layer 52 is prevented from being thickly deposited in the non-chip region 22, as described above. As a result, the dielectric layer is substantially prevented from remaining in the outermost regions of the chip region 20 over the polishing stopper layer 14. In other words, the dielectric layer in the outermost regions of the chip region 20 over the polishing stopper layer 14 is generally evenly polished with other portions of the dielectric layer in the chip region 20.

Furthermore, even when an isolated convex section is present in the chip region 20, the removal of the polishing stopper layer 14 at the isolated convex section is substantially suppressed when the dielectric layer 52 is polished. In other words, the occurrence of a thinning of the polishing stopper layer 14 at the isolated convex section is suppressed. Also, the occurrence of a dishing in an upper portion of the dielectric layer 52 is suppressed.

Figure 8:
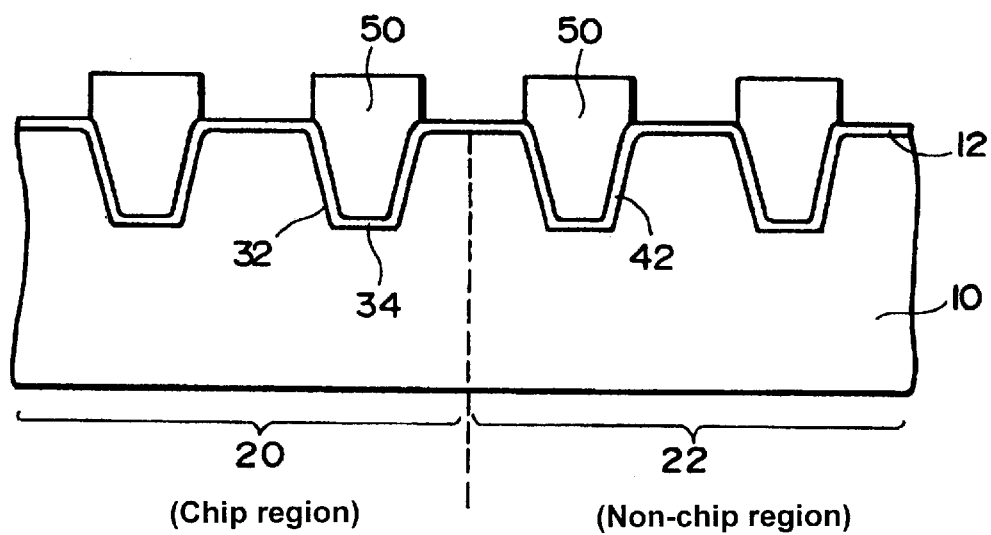
FIG. 8 schematically shows a cross-sectional view of a semiconductor wafer in a semiconductor wafer process step in accordance with one embodiment of the present invention.

(7) Then, as shown in FIG. 8, the polishing stopper layer 14 is removed using, for example, a heated phosphoric acid solution. Since the dielectric layer 52 is suppressed from remaining over the polishing stopper layer 14 in the chip region 20, the removal of the polishing stopper layer 14 is securely conducted.

As shown in FIG. 2, the pad layer 12 and upper portions of the dielectric layer 52 are isotropically etched by hydrofluoric acid. In this manner, the trench dielectric layers 50 are formed in the trenches 32, and the trench isolation region 30 is completed in the chip region 20. Also, at the same time, the trench dielectric layers 50 are formed in the dummy trenches 42, and the trench isolation region 40 is completed in the non-chip region 22.

The following effects are obtained by the method for processing a semiconductor wafer in accordance with the embodiment of the present invention described above.

In the present embodiment, the dummy trenches 42 are formed in the non-chip region 22. As a result, the dielectric layer 52 is prevented from being thickly deposited over the polishing stopper layer 14 in the non-chip region 22 compared to the dielectric layer 52 in the chip region 20. If the dielectric layer 52 deposited over the non-chip region 22 is substantially thicker, the dielectric layer 52 may remain over the polishing stopper layer 14 in outermost regions of the chip region 20, after the polishing of the dielectric layer 52 in the chip region 20, due to the presence of the thick dielectric layer 52 deposited over the non-chip region 22. However, in the present embodiment, the dielectric layer 52 is not thickly deposited in the non-chip region 22. As a result, the dielectric layer 52 is substantially prevented from remaining in the outermost regions of the chip region 20 over the polishing stopper layer 14. In other words, structures within the surface of the dielectric layer 52 become more uniform in the outermost regions of the chip region 20. Therefore, the yield of chips that are formed in the outermost regions of the chip regions is improved.

The semiconductor wafer processed in the manner described above is subject to further process steps to form, for example, semiconductor elements (for example, MOS elements) in the element forming regions. The semiconductor wafer in which semiconductor elements are formed is subjected to a dicing step to form chips.

[Experiment Samples]

Experiments are conducted to see how the dummy shot makes differences in the thickness of the dielectric layer that remains over the polishing stopper layer in the chip region and the non-chip region after the dielectric layer is polished. For the experiments, two types of samples are made. A sample that is subject to a dummy shot is referred to in this specification as an "embodiment sample" and a sample that is not subject to a dummy shot is referred to as a "comparison sample".

In the embodiment sample, a dummy shot is performed on a non-chip region adjacent to a chip region. The width of the dummy shot is set at 2 mm. Also, the dummy shot is placed at a point that is 0.1 mm away from a boundary between the chip region and the non-chip region.

Figure 9:
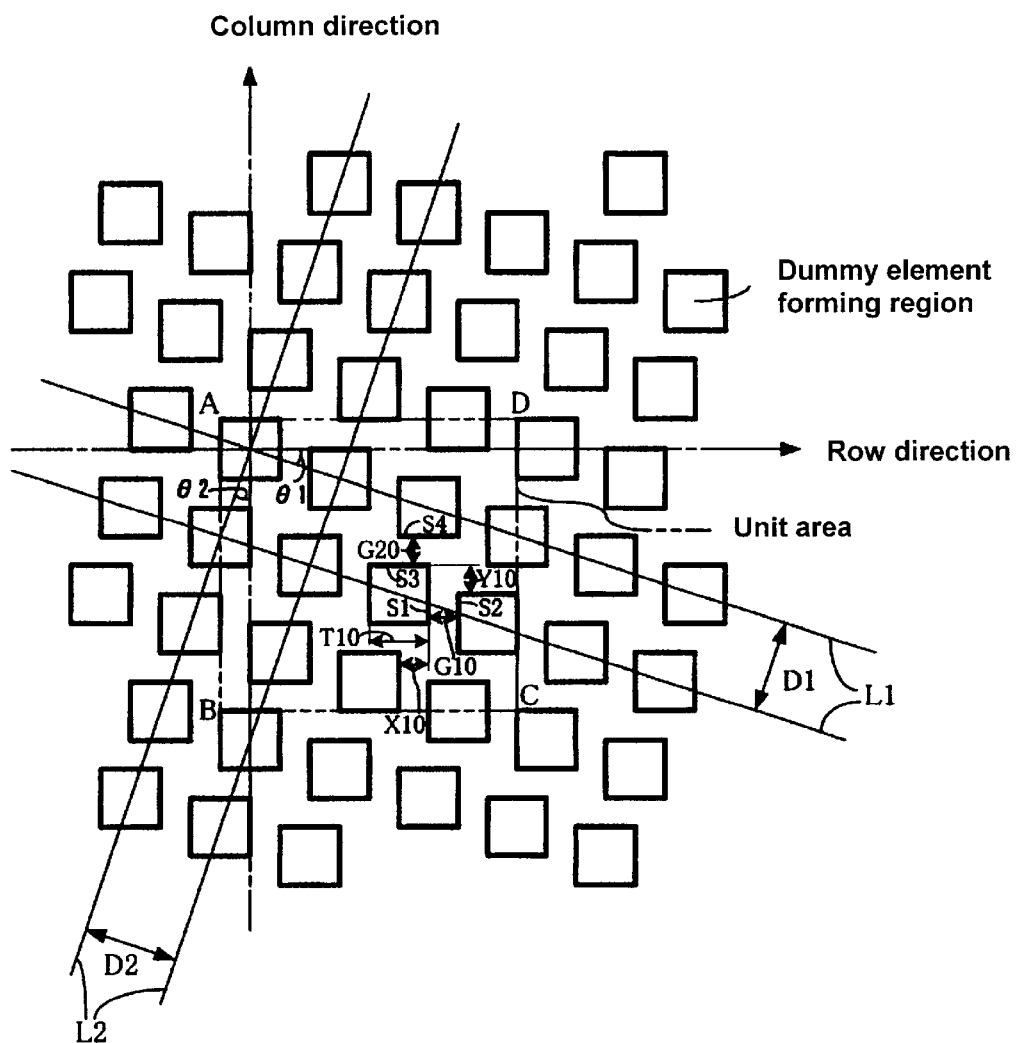
FIG. 9 shows a plan view of a pattern of disposed dummy element forming regions.

Also, the dummy shot is performed in a manner that dummy element forming regions are formed under the conditions described below. FIG. 9 shows a plan view of a pattern of the disposed dummy element forming regions.

a) First virtual linear lines L1 that extend in a direction traversing a row direction are defined, and the dummy element forming regions are disposed such that centers thereof are located on the first virtual linear lines L1.

b) Second virtual linear lines L2 that extend in a direction traversing a column direction are defined, and the dummy element forming regions are disposed such that centers thereof are located on the second virtual linear lines L2.

c) An angle θ1 between the first virtual linear lines and the row line is about 18.4 degree.
d) A distance D1 between adjacent ones of the first virtual linear lines is about 3.2 μm.
e) An angle θ2 between the second virtual linear lines and the column line is about 18.4 degree.
f) A distance D2 between adjacent ones of the second virtual linear lines is about 3.2 μm.
g) A ratio of an area of the dummy element forming regions occupied in a unit area (which is a rectangular area defined by points A, B, C and D in FIG. 9) is 40%.
h) A shape of each of the dummy element forming regions in plan view is square.
i) Each edge of each of the dummy element forming regions in plan view has a length of 2 μm.
j) A gap G10 between opposing edges of adjacent ones of the dummy element forming regions disposed on the same one of the first virtual linear lines is 1 μm.
k) A gap G20 between opposing edges of adjacent ones of the dummy element forming regions disposed on the same one of the second virtual linear lines is 1 μm.
l) An off set width Y10 in the column direction between opposing edges of adjacent ones of the dummy element forming regions disposed on the same one of the first virtual linear lines is 1 μm.
m) An off set width X10 in the row direction between opposing edges of adjacent ones of the dummy convex regions disposed on the same one of the second virtual linear lines is 1 μm.

Figure 10:
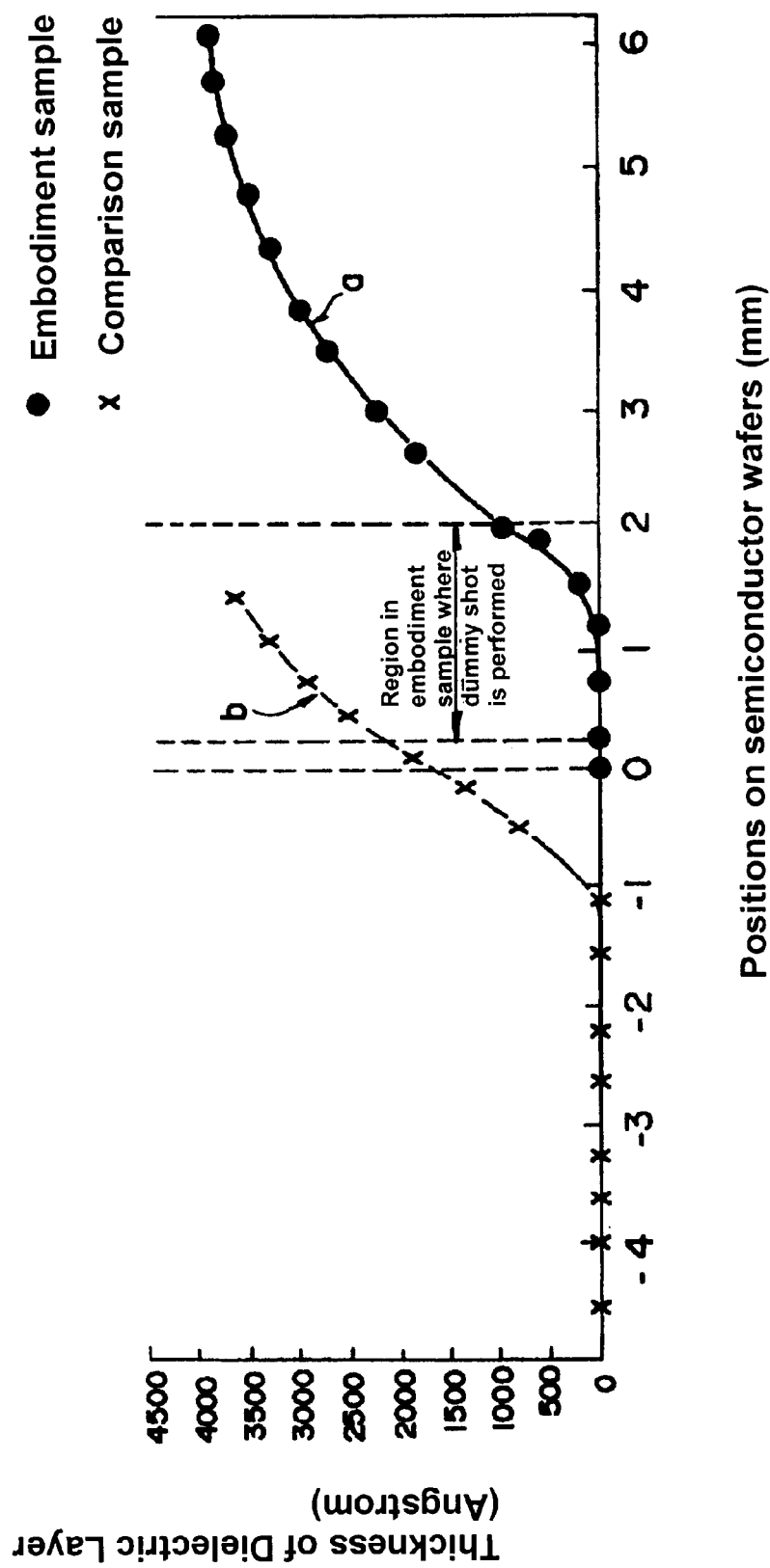
FIG. 10 is a graph showing distributions of thickness of dielectric layers that remain over polishing stopper layers in an embodiment sample and a comparison sample.
Figure 11:
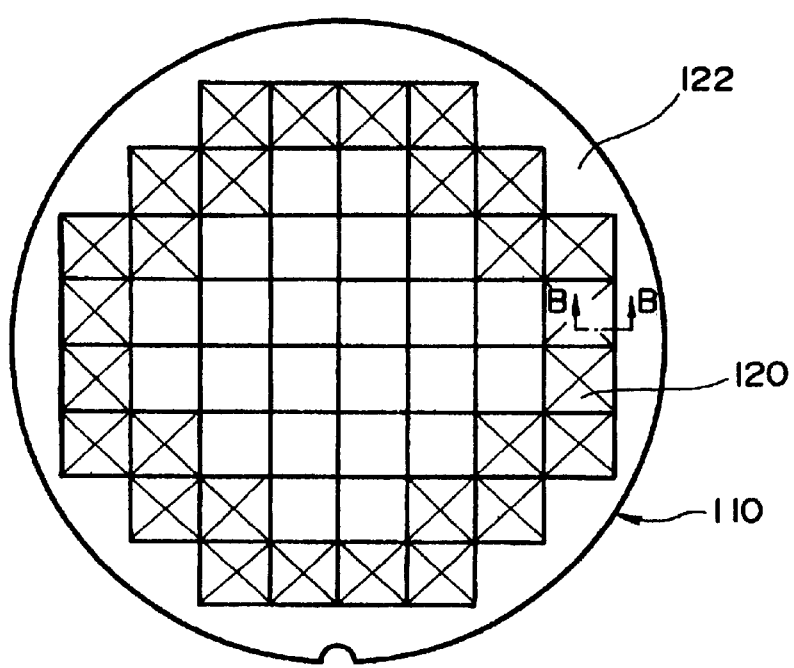
FIG. 11 shows a plan view of a semiconductor wafer over which a pad layer, a polishing stopper layer and a resist layer are successively deposited, and shows an area in which the resist layer formed over the semiconductor wafer is exposed.

FIG. 10 is a graph showing distributions of thickness of the dielectric layers that remain over the polishing stopper layers in the embodiment sample and the comparison sample. The reference point 0 shown in the graph is a boundary point between the chip region and the non-chip region. Negative side (on the left side) of the reference point 0 indicates the chip region, and positive side (on the right side) of the reference point 0 indicates the non-chip region. The thickness of the dielectric layer is measured from an upper surface of the polishing stopper layer. Reference a indicates a thickness distribution obtained from data of the embodiment sample, and reference b indicates a thickness distribution obtained from data of the comparison sample.

In the comparison sample, the dielectric layer remains over the polishing stopper layer at the reference point 0. In contrast, in the embodiment sample, the dielectric layer does not remain over the polishing stopper layer at the reference point 0. Accordingly, it is confirmed that the dummy shot improves the uniformity within the surface of the dielectric layer in the chip region adjacent to the non-chip region.

While the description above refers to particular embodiments of the present invention, it will be understood that many modifications may be made without departing from the spirit thereof The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method for processing a semiconductor wafer defining a chip region and a non-chip region, the method comprising the steps of:
    forming trench isolation regions in the semiconductor wafer; and
    forming dummy trench isolation regions in at least a part of the non-chip region of the semiconductor wafer.

2. A method for processing a semiconductor wafer defining a chip region and a non-chip region, the method comprising the steps of:
    (A) forming trench isolation regions in the semiconductor wafer, wherein the step (A) comprises the steps of:
        (a) forming a polishing stopper layer having a specified pattern over the semiconductor wafer;
        (b) forming trenches in the chip region and dummy trenches in at least a portion of the non-chip region in the semiconductor wafer using at least the polishing stopper layer as a mask;
        (c) forming a dielectric layer over the semiconductor wafer and filling the trenches and the dummy trenches with the dielectric layer; and
        (d) polishing the dielectric layer using the polishing stopper layer as a stopper.

3. A method for processing a semiconductor wafer defining a chip region and a non-chip region, the method comprising the steps of:
    (A) forming trench isolation regions in the semiconductor wafer, wherein the step (A) comprises the steps of:
        (h) forming a polishing stopper layer over the semiconductor wafer;
        (i) forming a resist layer over the polishing stopper layer;
        (j) exposing the resist layer in the chip region and at least one specified portion of the non-chip region;
        (k) developing the resist layer;
        (l) removing the polishing stopper layer in a specified pattern using the resist layer as a mask;
        (m) etching the semiconductor wafer using at least the polishing stopper layer to form trenches in the chip region and dummy trenches in the non-chip region;
        (n) forming a dielectric layer over the semiconductor wafer and filling the trenches and the dummy trenches with the dielectric layer; and
        (o) polishing the dielectric layer using the polishing stopper layer as a stopper.

4. A method for processing a semiconductor wafer according to claim 3, wherein a photomask is used in the step (j) to expose the resist layer in the chip region and the at least one specified portion of the non-chip region.

5. A semiconductor wafer comprising:
    a chip region and a non-chip region, wherein at least one portion of the non-chip region includes a dummy trench isolation region.

6. A method for manufacturing a semiconductor device, the method comprising the steps of:
    defining a chip region and a non-chip region in a semiconductor wafer; and
    forming trench isolation regions in the chip region and in at least a part of the non-chip region of the semiconductor wafer.

7. A method for manufacturing a semiconductor device according to claim 6, wherein the step of forming the trench isolation regions comprises the steps of:
    (a) forming a polishing stopper layer having a specified pattern over the semiconductor wafer;
    (b) forming trenches in the chip region and dummy trenches in the at least one portion of the non-chip region in the semiconductor wafer using at least the polishing stopper layer as a mask;
    (c) forming a dielectric layer over the semiconductor wafer and filling the trenches and the dummy trenches with the dielectric layer; and (d) polishing the dielectric layer using the polishing stopper layer as a stopper.

8. A method for manufacturing a semiconductor device, the method comprising the steps of:

defining a chip region and a non-chip region in a semiconductor wafer; and forming trench isolation regions in the chip region and in at least a part of the non-chip region of the semiconductor wafer, wherein the step of forming the trench isolation regions comprises the steps of:

(h) forming a polishing stopper layer over the semiconductor wafer;

(i) forming a resist layer over the polishing stopper layer;

(j) exposing the resist layer in the chip region and at least one specified portion of the non-chip region;

(k) developing the resist layer;

(l) removing the polishing stopper layer in a specified pattern using the resist layer as a mask;

(m) etching the semiconductor wafer using at least the polishing stopper layer to form trenches in the chip region and dummy trenches in the non-chip region;

(n) forming a dielectric layer over the semiconductor wafer and filling the trenches and the dummy trenches with the dielectric layer; and (o) polishing the dielectric layer using the polishing stopper layer as a stopper.

9. A method for processing a semiconductor wafer according to claim 8, wherein a photomask is used in the step (j) to simultaneously expose the resist layer in the chip region and the at least one specified portion of the non-chip region.

10. A method for processing a semiconductor wafer, the method comprising the steps of:

defining a chip region and a non-chip region in the semiconductor wafer; and forming trench isolation regions in the chip region and in at least a part of the non-chip region of the semiconductor wafer.

11. A method for processing a semiconductor wafer according to claim 10, wherein the step of forming the trench isolation regions comprises the steps of:

(a) forming a polishing stopper layer having a specified pattern over the semiconductor wafer;

(b) forming trenches in the semiconductor wafer using at least the polishing stopper layer as a mask;

(c) forming a dielectric layer over the semiconductor wafer and filling the trenches with the dielectric layer; and (d) polishing the dielectric layer using the polishing stopper layer as a stopper.

12. A method for processing a semiconductor wafer, the method comprising the steps of:

defining a chip region and a non-chip region in the semiconductor wafer; and forming trench isolation regions in the chip region and in at least a part of the non-chip region of the semiconductor wafer, wherein the step of forming the trench isolation regions comprises the steps of:

(a) forming a polishing stopper layer over the semiconductor wafer;

(b) forming a resist layer over the polishing stopper layer;

(c) exposing the resist layer in the chip region and at least one specified portion of the non-chip region;

(d) developing the resist layer;

(e) removing the polishing stopper layer in a specified pattern using the resist layer as a mask;

(f) etching the semiconductor wafer using at least the polishing stopper layer to form trenches in the chip region and the non-chip region;

(g) forming a dielectric layer over the semiconductor wafer and filling the trenches with the dielectric layer; and (h) polishing the dielectric layer using the polishing stopper layer as a stopper.

13. A method for processing a semiconductor wafer according to claim 12, wherein a photomask is used in the step (j) to simultaneously expose the resist layer in the chip region and the at least one specified portion of the non-chip region.

* * * * *